(12) United States Patent
Shimizu et al.

(10) Patent No.: US 10,601,307 B1
(45) Date of Patent: Mar. 24, 2020

(54) SEMICONDUCTOR DEVICE AND METHOD FOR MANUFACTURING THE SAME

(71) Applicant: Mitsubishi Electric Corporation, Tokyo (JP)

(72) Inventors: Yasutaka Shimizu, Tokyo (JP); Yuji Miyazaki, Tokyo (JP); Kazuya Okada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/450,115

(22) Filed: Jun. 24, 2019

(30) Foreign Application Priority Data

Sep. 12, 2018 (JP) .................................. 2018-170202

(51) Int. Cl.

| | |
|---|---|
| H02M 1/00 | (2006.01) |
| H02M 1/34 | (2007.01) |
| H01L 27/06 | (2006.01) |
| H01L 25/07 | (2006.01) |
| H01L 25/18 | (2006.01) |
| H02M 7/48 | (2007.01) |
| H01L 23/64 | (2006.01) |
| H01L 23/00 | (2006.01) |
| H01L 29/94 | (2006.01) |

(52) U.S. Cl.
CPC ............ *H02M 1/34* (2013.01); *H01L 23/647* (2013.01); *H01L 24/48* (2013.01); *H01L 25/07* (2013.01); *H01L 25/18* (2013.01); *H01L 27/0629* (2013.01); *H01L 29/94* (2013.01); *H02M 7/48* (2013.01); *H01L 2224/48091* (2013.01); *H01L 2924/1304* (2013.01); *H01L 2924/19101* (2013.01); *H02M 2001/348* (2013.01)

(58) Field of Classification Search
CPC .... H02M 1/34; H02M 7/48; H02M 2001/348; H01L 25/07; H01L 24/48; H01L 25/18
See application file for complete search history.

(56) References Cited

U.S. PATENT DOCUMENTS

2017/0229572 A1* 8/2017 Nagase ............... H01L 29/1095

FOREIGN PATENT DOCUMENTS

| JP | 2017-208987 A | 11/2017 |
|---|---|---|
| WO | 2018-143429 A1 | 8/2018 |

* cited by examiner

*Primary Examiner* — Adolf D Berhane
*Assistant Examiner* — Afework S Demisse
(74) *Attorney, Agent, or Firm* — Studebaker & Brackett PC

(57) ABSTRACT

The object is to provide a technology for enabling detection of the voltage resistance in an assembled snubber substrate. A semiconductor device includes: a snubber substrate fixed to a base while being spaced from a p electrode and an n electrode; a snubber circuit disposed on the snubber substrate and electrically connected to the p electrode and the n electrode; and a semiconductor element electrically connected to the snubber circuit. The base includes an insulating component insulating the p electrode, the n electrode, and the snubber substrate from one another.

10 Claims, 8 Drawing Sheets

SEMICONDUCTOR DEVICE AND METHOD FOR MANUFACTURING THE SAME

BACKGROUND OF THE INVENTION

Field of the Invention

The present invention relates to a semiconductor device and a method for manufacturing the same.

Description of the Background Art

Semiconductor devices are applied in various situations including efficient use and reproduction of energy in power generation and supply. Such semiconductor devices include a snubber circuit for removing noise in switching operations as disclosed in, for example, Japanese Patent Application Laid-Open No. 2017-208987.

Since the conventional semiconductor devices include a snubber substrate disposed on one of an n electrode and a p electrode, a problem of failing to detect the voltage resistance of the snubber substrate itself occurs after assembly of the semiconductor devices.

SUMMARY

The present invention has been conceived in view of the problem, and has an object of providing a technology for enabling detection of the voltage resistance in an assembled snubber substrate.

A semiconductor device according to the present invention includes: a base; a p electrode with a positive conductor pattern, and an n electrode with a negative conductor pattern, the p electrode and the n electrode being disposed on the base with a spacing; a snubber substrate fixed to the base while being spaced from the p electrode and the n electrode; a snubber circuit disposed on the snubber substrate and electrically connected to the p electrode and the n electrode; and a semiconductor element electrically connected to the snubber circuit. The base includes an insulating component insulating the p electrode, the n electrode, and the snubber substrate from one another.

Thus, it is possible to detect the voltage resistance in an assembled snubber substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiment 1

Figure 1:
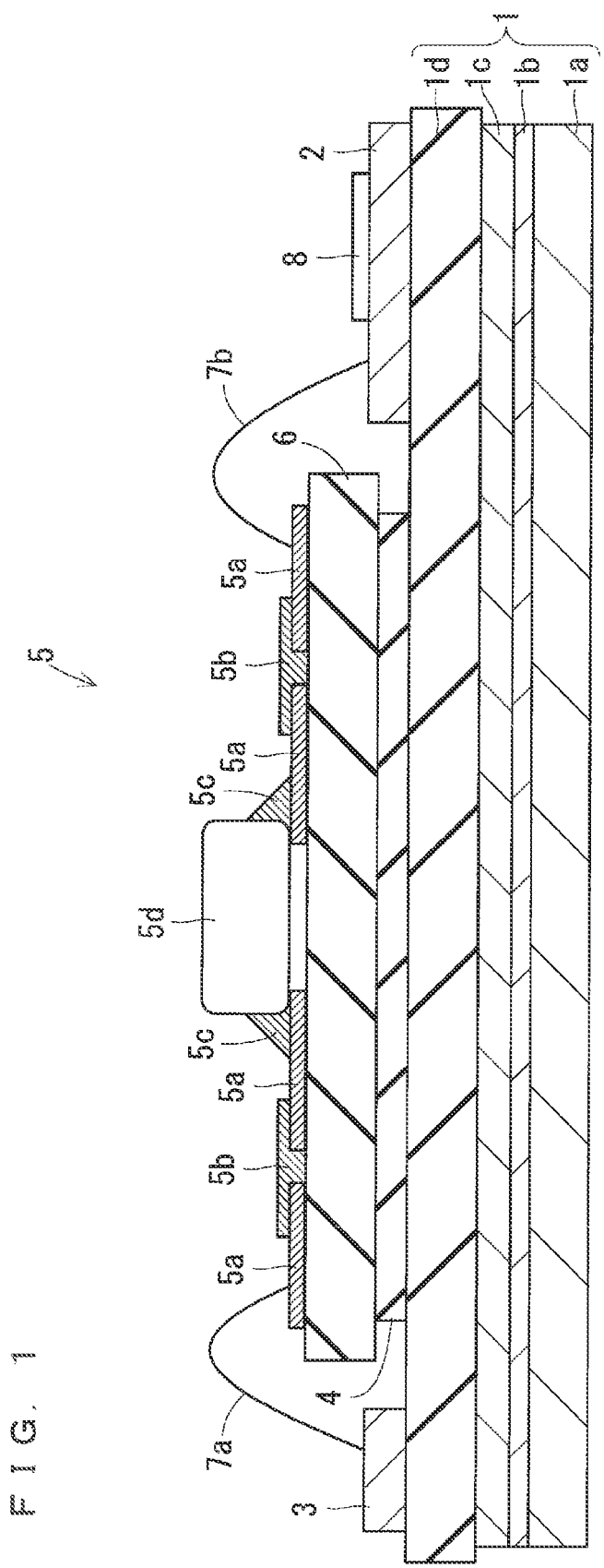
FIG. 1 is a cross-sectional view illustrating a structure of a semiconductor device according to Preferred Embodiment 1.

FIG. 1 is a cross-sectional view illustrating a structure of a semiconductor device according to Preferred Embodiment 1 of the present invention. The semiconductor device in FIG. 1 includes a base 1, a p electrode 2 with a positive conductor pattern, an n electrode 3 with a negative conductor pattern, a bonding material 4, a snubber circuit 5, a snubber substrate 6, wires 7a and 7b, and a semiconductor element 8. The semiconductor device according to Preferred Embodiment 1 may further include a case for enclosing these components, and a resin charged into the case.

The base 1 includes an insulating component. According to Preferred Embodiment 1, the insulating component includes an insulating ceramic substrate 1d, and the base 1 further includes a base plate 1a, a bonding material 1b, and a metal pattern 1c. The base plate 1a is made of, for example, copper. The metal pattern 1c is disposed on a lower surface of the ceramic substrate 1d. The bonding material 1b is, for example, a solder, and bonds the metal pattern 1c to the base plate 1a. Consequently, the ceramic substrate 1d, which is hardly fixed by the bonding material 1b such as a solder, is fixed to the base plate 1a through the metal pattern 1c which is easily fixed by the bonding material 1b such as a solder.

The p electrode 2 and the n electrode 3 are disposed on the ceramic substrate 1d of the base 1 with a spacing.

The bonding material 4 fixes the snubber substrate 6 to the ceramic substrate 1d of the base 1. The bonding material 4 according to Preferred Embodiment 1 is a silicone-based material, and contains silicone.

The snubber substrate 6 is fixed to the ceramic substrate 1d of the base 1 while being spaced from the p electrode 2 and the n electrode 3. Although the snubber substrate 6 is disposed between the p electrode 2 and the n electrode 3 according to Preferred Embodiment 1, it may not necessarily be disposed between the p electrode 2 and the n electrode 3. The snubber substrate 6 may be an insulating substrate other than an insulating ceramic substrate.

The snubber circuit 5 is disposed on the snubber substrate 6, and is electrically connected to the p electrode 2 and the n electrode 3. The snubber circuit 5 includes a plurality of conductors 5a (conductors 5a at the right end, on the right and left of a capacitor 5d, and at the left end), resistors 5b, a bonding material 5c, and the capacitor 5d according to Preferred Embodiment 1.

The plurality of conductors 5a are disposed on the snubber substrate 6 with spacings. The conductor 5a at the right end is electrically connected to the p electrode 2 through a wire 7b. The conductor 5a on the right of the capacitor 5d is electrically connected to the conductor 5a at the right end through the resistor 5b, and is electrically connected to the capacitor 5d with the bonding material 5c. The conductor 5a at the left end is electrically connected to the n electrode 3 through a wire 7a. The conductor 5a on the left of the capacitor 5d is electrically connected to the conductor 5a at the left end through the resistor 5b, and is electrically connected to the capacitor 5d with the bonding material 5c. Substantially, the snubber circuit 5 has only to include a resistor and a capacitor, and the structure of the snubber circuit 5 is not limited to the aforementioned structure.

The semiconductor element 8 is electrically connected to the snubber circuit 5. Thus, the snubber circuit 5 can remove noise in switching operations of the semiconductor element 8. The semiconductor element 8 is at least one of, for example, a metal oxide semiconductor field effect transistor (MOSFET), an insulated gate bipolar transistor (IGBT), a Schottky barrier diode (SBD), and a pn diode. The semiconductor element 8 may be one of these elements or a circuit including these elements. The semiconductor element 8 will be hereinafter described as an inverter having upper and lower arms as one example.

Although the semiconductor element 8 is disposed on the p electrode 2 in FIG. 1, it is not limited to such but may be disposed on, for example, the n electrode 3. Although the semiconductor element 8 in FIG. 1 is electrically connected to the snubber circuit 5 through the wire 7b and the p electrode 2, it may be electrically connected to the snubber circuit 5 through the constituent elements other than the wire 7b and the p electrode 2.

The ceramic substrate 1d of the base 1 insulates the p electrode 2, the n electrode 3, and the snubber substrate 6 from one another.

Figure 2:
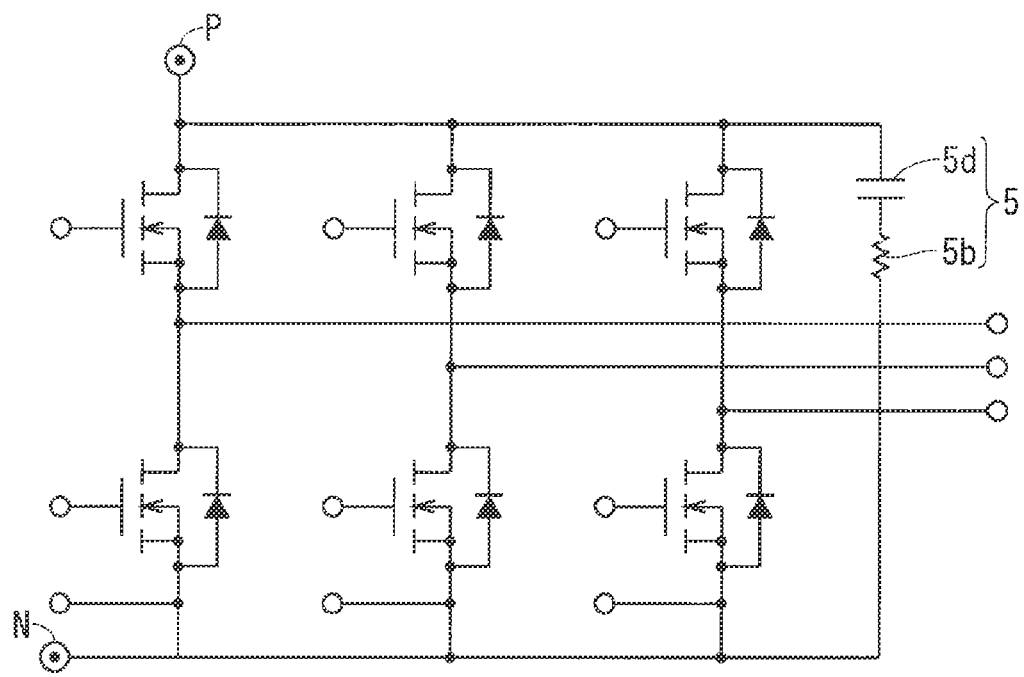
FIG. 2 is a circuit diagram illustrating an example circuit for conducting a dielectric withstand voltage test on the semiconductor device according to Preferred Embodiment 1.

FIG. 2 is a circuit diagram illustrating an example circuit for conducting a dielectric withstand voltage test on the semiconductor device according to Preferred Embodiment 1. Specifically, this dielectric withstand voltage test is a dielectric withstand voltage test on a voltage to ground of a semiconductor device module including the semiconductor device according to Preferred Embodiment 1, and more specifically, a test for inspecting the integrity (voltage resistance) of the snubber circuit 5. Since a p electrode and an n electrode have the same potential when this test is conducted, the p electrode 2 and the n electrode 3 also have the same potential.

Figure 3:
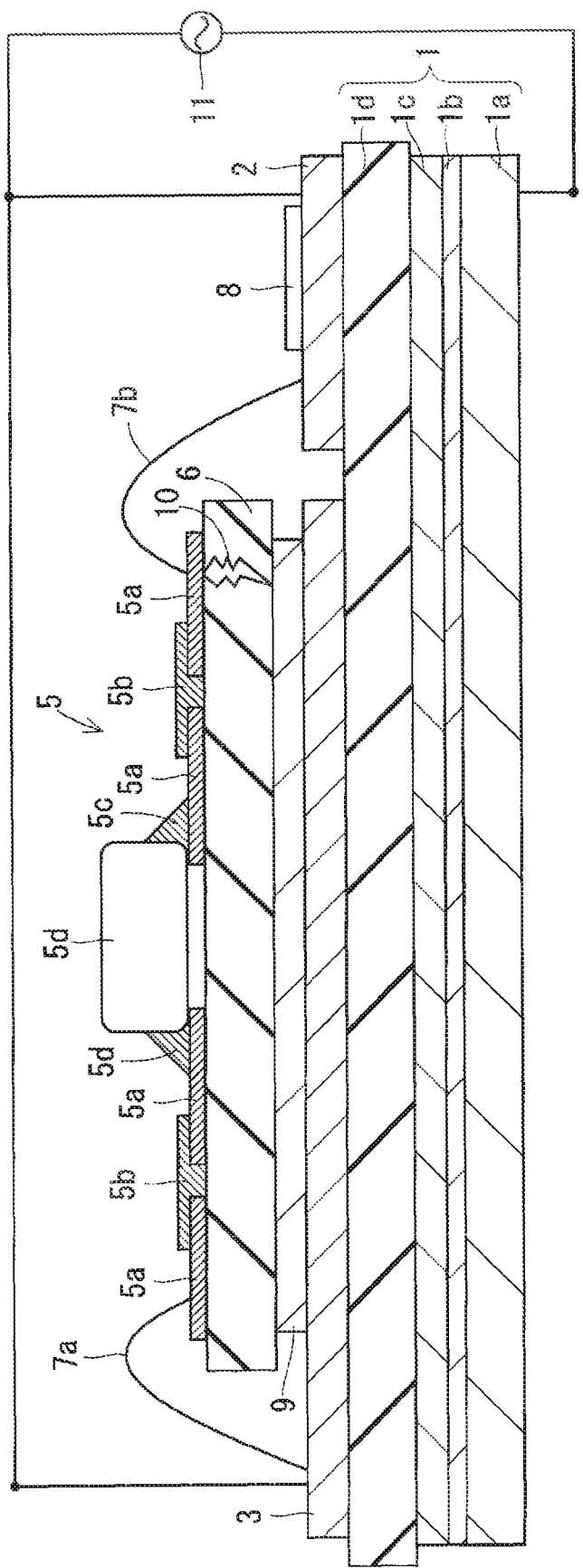
FIG. 3 is a cross-sectional view illustrating a structure of a relevant semiconductor device.

Here, a semiconductor device relevant to the semiconductor device according to Preferred Embodiment 1 (hereinafter referred to as a "relevant semiconductor device") will be described. FIG. 3 is a cross-sectional view illustrating a structure of the relevant semiconductor device. Among constituent elements of the relevant semiconductor device, the constituent elements identical or similar to those of the semiconductor device according to Preferred Embodiment 1 will be denoted by the same reference numerals, and the different constituent elements will be hereinafter mainly described.

As illustrated in FIG. 3, the n electrode 3 extends in a plane direction, and the snubber circuit 5 and the snubber substrate 6 are bonded to the extended portion of the n electrode 3 with a bonding material 9 such as a solder in the relevant semiconductor device. It is assumed to conduct the test illustrated in FIG. 2 by connecting one terminal of an AC power supply 11 to the p electrode 2 and the n electrode 3 and connecting another terminal of the AC power supply 11 to the base plate 1a in this relevant semiconductor device as illustrated in FIG. 3.

When a crack 10 illustrated in FIG. 3 does not appear in the snubber substrate 6, the electrical characteristics between the p electrode 2 and the n electrode 3, and the base plate 1a are detected in the test. Even when the crack 10 appears in the snubber substrate 6 as illustrated in FIG. 3 and the snubber circuit 5 short-circuits the n electrode 3, the electrical characteristics between the p electrode 2 and the n electrode 3, and the base plate 1a are detected in the test because the snubber substrate 6 is opposite to the base plate 1a with respect to the n electrode 3. The electrical characteristics to be detected from the structure in FIG. 3 do not vary depending on the occurrence of the crack 10 in the snubber substrate 6. Thus, the occurrence of the crack 10 in the assembled snubber substrate 6, and further the voltage resistance of the assembled snubber substrate 6 itself cannot be detected.

In contrast in the semiconductor device according to Preferred Embodiment 1 (FIG. 1), the p electrode 2, the n electrode 3, and the snubber substrate 6 are spaced from one another on the base 1, and the ceramic substrate 1d of the base 1 insulates the p electrode 2, the n electrode 3, and the snubber substrate 6 from one another. Under such a structure, the electrical characteristics between the base plate 1a and the p electrode 2, the n electrode 3, and the snubber circuit 5 are detected in the test. The electrical characteristics to be detected vary depending on the occurrence of the crack 10 in the snubber substrate 6. Thus, it is possible to detect the occurrence of the crack 10 in the assembled snubber substrate 6, and further the voltage resistance of the assembled snubber substrate 6 itself in the semiconductor device according to Preferred Embodiment 1.

Since the ceramic substrate 1d is disposed in a laminating direction of the p electrode 2, the n electrode 3, and the snubber substrate 6, the semiconductor device can be downsized according to Preferred Embodiment 1.

The bonding material 4 for fixing the snubber substrate 6 to the base 1 contains silicone according to Preferred Embodiment 1. This bonding material 4 relaxes the bending stress produced when the semiconductor device is assembled or in temperature cycling after assembly. Thus, the bonding material 4 can reduce malfunctions including a crack in the snubber substrate 6 caused by the bending stress. The bonding material 4 may not necessarily be a material containing silicone but may be made of, for example, an insulating elastic material.

The semiconductor element 8 preferably contains silicon (Si) or a wide bandgap semiconductor. Examples of the wide bandgap semiconductor herein include silicon carbide (SiC), gallium nitride (GaN), and diamond. Although a semiconductor device including the semiconductor element 8 containing SiC, and further a power semiconductor module including the semiconductor device can increase the switching speed more than that of a semiconductor device including the semiconductor element 8 containing Si, they have a problem of being more susceptible to noise as the switching speed increases. Since the snubber circuit 5 is applied in Preferred Embodiment 1, noise can be reduced.

The snubber circuit 5 may be formed by printing a paste and the conductors 5a on the snubber substrate 6 that is an insulating ceramic substrate and forming the resistors 5b by firing the paste. Since such a manufacturing method enables the snubber substrate 6 that is a ceramic substrate to dissipate the heat of the resistors 5b in switching operations, the life of the semiconductor device can be increased.

The semiconductor device may be formed by fixing the semiconductor element 8 to the base 1 and then fixing the snubber substrate 6 to the base 1. Such a manufacturing method can prevent, from influencing the snubber substrate 6, the bending stress caused by the temperature in mounting the semiconductor element 8 on the base 1. Thus, the occurrence of a crack in the snubber substrate 6 can be prevented.

Preferred Embodiment 2

Figure 4:
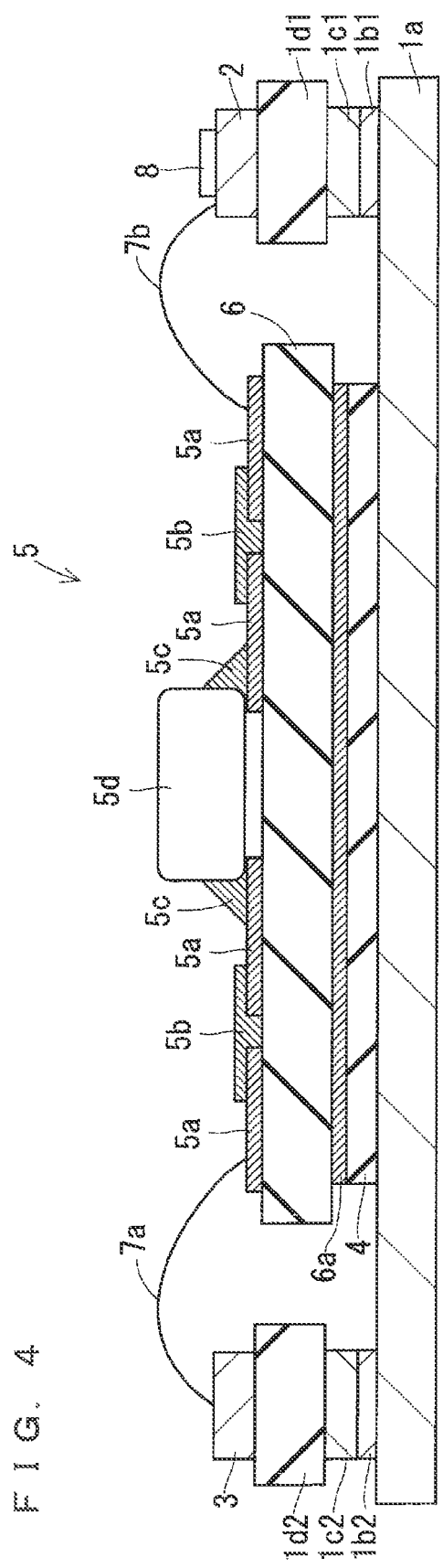
FIG. 4 is a cross-sectional view illustrating a structure of a semiconductor device according to Preferred Embodiment 2.

FIG. 4 is a cross-sectional view illustrating a structure of a semiconductor device according to Preferred Embodiment 2 of the present invention. Among constituent elements of the semiconductor device according to Preferred Embodiment 2, the constituent elements identical or similar to those described above will be denoted by the same reference numerals, and the different constituent elements will be hereinafter mainly described.

The insulating component of the base 1 according to Preferred Embodiment 2 includes, instead of the ceramic substrate 1d, a first ceramic substrate 1d1 and a second ceramic substrate 1d2 that are made of the same material as that of the ceramic substrate 1d. The base 1 according to Preferred Embodiment 2 includes, instead of the bonding material 1b and the metal pattern 1c, a first bonding material 1b1 and a second bonding material 1b2 that are made of the same material as that of the bonding material 1b, and a first metal pattern 1c1 and a second metal pattern 1c2 that are made of the same material as that of the metal pattern 1c.

The snubber substrate 6 is fixed to the base plate 1a. A metal pattern 6a is disposed on a lower surface of the snubber substrate 6 according to Preferred Embodiment 2, and the bonding material 4 bonds the metal pattern 6a to the base plate 1a. The bonding material 4 may be a silicone-based material similarly as Embodiment 1, a solder, or a composite of a silicone-based material and a solder.

The first ceramic substrate 1d1 and the first metal pattern 1c1 are disposed between the base plate 1a and the p electrode 2. The first bonding material 1b1 bonds, to the base plate 1a, the first metal pattern 1c1 disposed on a lower surface of the first ceramic substrate 1d1.

The second ceramic substrate 1d2 and the second metal pattern 1c2 are disposed between the base plate 1a and the n electrode 3. The second bonding material 1b2 bonds, to the base plate 1a, the second metal pattern 1c2 disposed on a lower surface of the second ceramic substrate 1d2.

In the semiconductor device according to Preferred Embodiment 2 with such a structure, the first ceramic substrate 1d1 and the second ceramic substrate 1d2 of the base 1 insulate the p electrode 2, the n electrode 3, and the snubber substrate 6 from one another. Thus, it is possible to detect the voltage resistance of the assembled snubber substrate 6 itself, similarly as Preferred Embodiment 1. When a cooling fin is provided on a lower surface of the base plate 1a, the snubber substrate 6 can be closer to the cooling fin according to Preferred Embodiment 2 than that according to Preferred Embodiment 1. Thus, the heat generated in the snubber circuit 5 can be dissipated more significantly.

Preferred Embodiment 3

Figure 5:
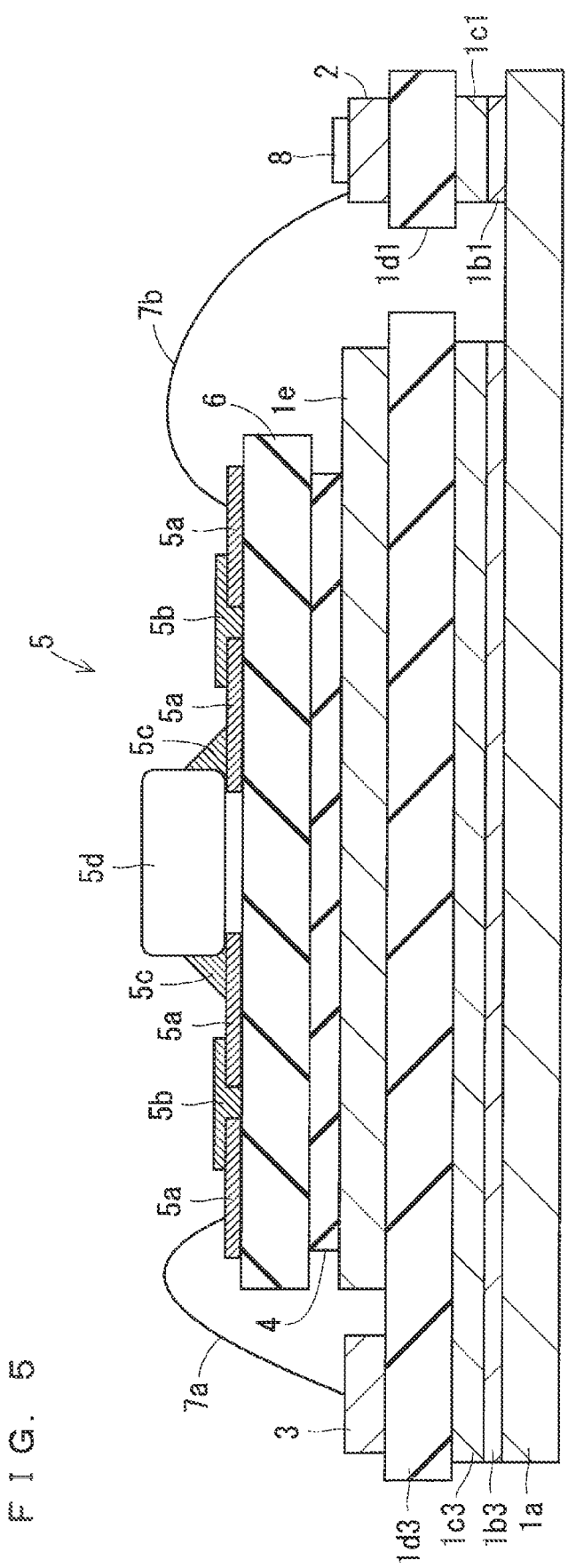
FIG. 5 is a cross-sectional view illustrating a structure of a semiconductor device according to Preferred Embodiment 3.
Figure 6:
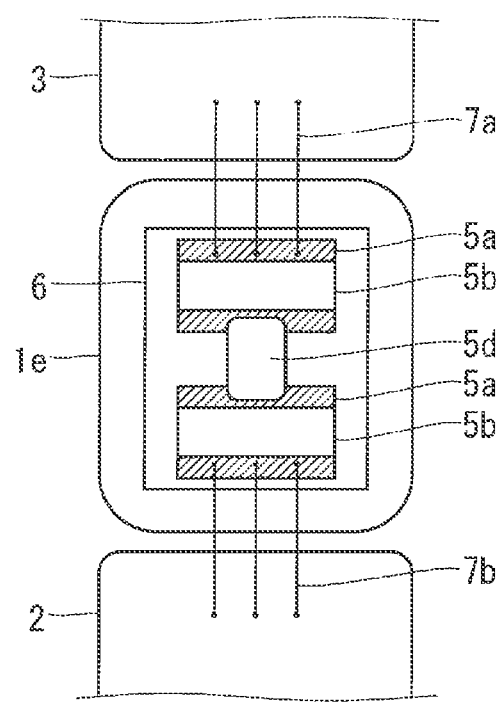
FIG. 6 is a plan view illustrating a part of the structure of the semiconductor device according to Preferred Embodiment 3.

FIG. 5 is a cross-sectional view illustrating a structure of a semiconductor device according to Preferred Embodiment 3 of the present invention, and FIG. 6 is a plan view illustrating a part of the structure. Among constituent elements of the semiconductor device according to Preferred Embodiment 3, the constituent elements identical or similar to those described above will be denoted by the same reference numerals, and the different constituent elements will be hereinafter mainly described.

The insulating component of the base 1 according to Preferred Embodiment 3 includes, instead of the ceramic substrate 1d, the first ceramic substrate 1d1 and a third ceramic substrate 1d3 that are made of the same material as that of the ceramic substrate 1d. The base 1 according to Preferred Embodiment 3 includes, instead of the bonding material 1b and the metal pattern 1c, the first bonding material 1b1 and a third bonding material 1b3 that are made of the same material as that of the bonding material 1b, and the first metal pattern 1c1 and a third metal pattern 1c3 that are made of the same material as that of the metal pattern 1c. The base 1 according to Preferred Embodiment 3 further includes a metal pattern 1e.

The third metal pattern 1c3 is disposed on a lower surface of the third ceramic substrate 1d3. The third bonding material 1b3 bonds the third metal pattern 1c3 to the base plate 1a. The n electrode 3 and the metal pattern 1e are disposed on the third ceramic substrate 1d3 with a spacing. The first ceramic substrate 1d1 and the third ceramic substrate 1d3 insulate this metal pattern 1e from the p electrode 2 and the n electrode 3. The metal pattern 1e is fixed above the base plate 1a. The snubber substrate 6 is fixed to the metal pattern 1e with the bonding material 4.

In the semiconductor device according to Preferred Embodiment 3 with such a structure, the first ceramic substrate 1d1 and the third ceramic substrate 1d3 of the base 1 insulate the p electrode 2, the n electrode 3, and the snubber substrate 6 from one another. Thus, it is possible to detect the voltage resistance of the assembled snubber substrate 6 itself, similarly as Preferred Embodiment 1. Since, for example, a solder can be used as the bonding material 4 according to Preferred Embodiment 3, the heat generated in the snubber circuit 5 can be dissipated more significantly.

If the potential of the metal pattern 1e is a floating potential, the potential of the metal pattern 1e cannot be managed. Thus, it is preferred to take a measure on reducing the charge-up phenomenon in the metal pattern 1e in advance.

Preferred Embodiment 4

Figure 7:
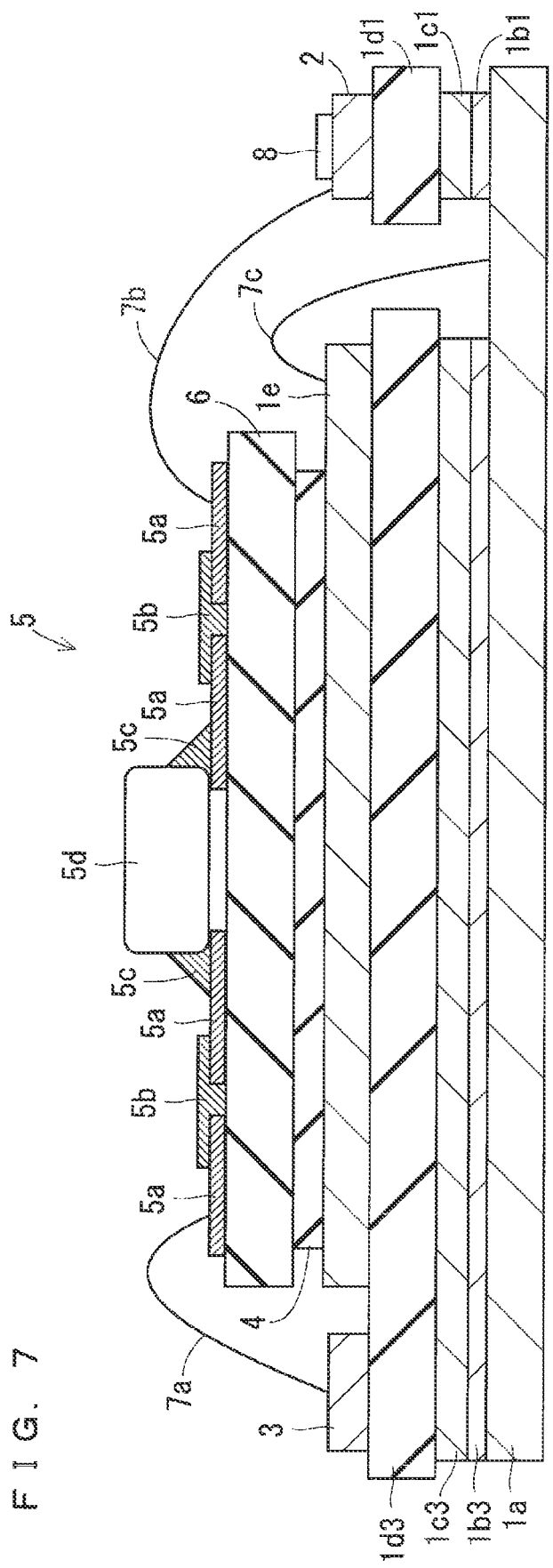
FIG. 7 is a cross-sectional view illustrating a structure of a semiconductor device according to Preferred Embodiment 4.

FIG. 7 is a cross-sectional view illustrating a structure of a semiconductor device according to Preferred Embodiment 4 of the present invention. Among constituent elements of the semiconductor device according to Preferred Embodiment 4, the constituent elements identical or similar to those described above will be denoted by the same reference numerals, and the different constituent elements will be hereinafter mainly described.

In addition to the structure of the semiconductor device according to Preferred Embodiment 3 (FIG. 5), the semiconductor device according to Preferred Embodiment 4 has a structure including a conductive component such as a wire 7c for electrically connecting the metal pattern 1e to the base plate 1a. With this structure, the potential of the metal pattern 1e is equal to the potential of the base plate 1a.

This structure can produce the same advantages as those according to Preferred Embodiment 3. Thus, it is preferred to take a measure on the charge-up phenomenon in the metal pattern 1e.

Preferred Embodiment 5

Figure 8:
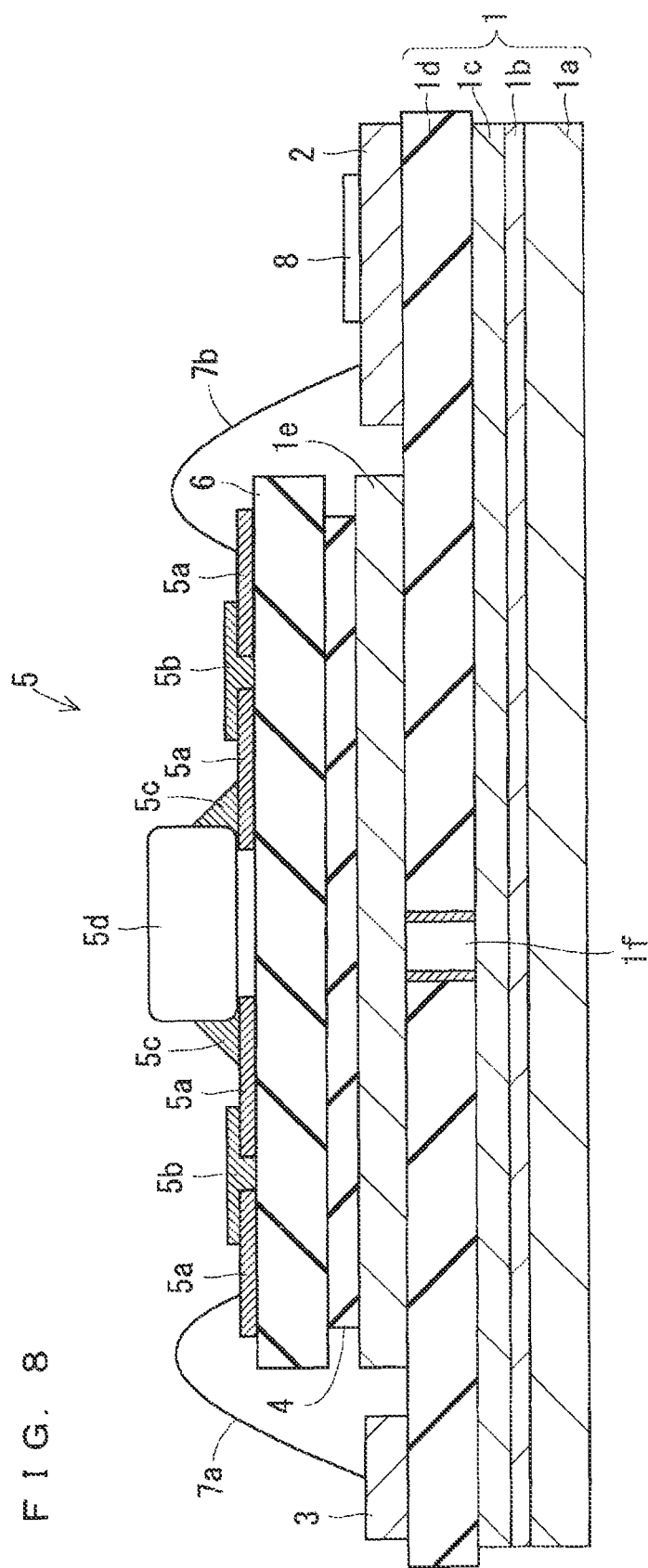
FIG. 8 is a cross-sectional view illustrating a structure of a semiconductor device according to Preferred Embodiment 5.

FIG. 8 is a cross-sectional view illustrating a structure of a semiconductor device according to Preferred Embodiment 5 of the present invention. Among constituent elements of the semiconductor device according to Preferred Embodiment 5, the constituent elements identical or similar to those described above will be denoted by the same reference numerals, and the different constituent elements will be hereinafter mainly described.

The base 1 according to Preferred Embodiment 5 has a structure in which the metal pattern 1e according to Preferred Embodiment 3 has been added onto the ceramic substrate 1d of the base 1 according to Preferred Embodiment 1 (FIG. 1). The insulating component of the base 1 according to Preferred Embodiment 5 includes the ceramic substrate 1d that is disposed between the metal pattern 1e and the base plate 1a. The metal pattern 1e is electrically connected to the base plate 1a through a through hole 1f formed in the ceramic substrate 1d. The through hole 1f includes a via formed in the ceramic substrate 1d, and a metal film formed on a wall surface surrounding the via. With this through hole 1f, the potential of the metal pattern 1e is equal to the potential of the base plate 1a.

This structure can produce the same advantages as those according to Preferred Embodiment 3. Since it is possible to take a measure on the charge-up phenomenon in the metal pattern 1e without having the wire 7c as described in Preferred Embodiment 4, the semiconductor device and a power semiconductor module including the semiconductor device can be downsized.

Embodiments can be freely combined, and appropriately modified or omitted within the scope of the invention.

What is claimed is:

1. A semiconductor device, comprising:
   a base;
   a p electrode with a positive conductor pattern, and an n electrode with a negative conductor pattern, the p electrode and the n electrode being disposed on the base with a spacing;
   a snubber substrate fixed to the base while being spaced from the p electrode and the n electrode;
   a snubber circuit disposed on the snubber substrate and electrically connected to the p electrode and the n electrode; and
   a semiconductor element electrically connected to the snubber circuit,
   wherein the base includes an insulating component insulating the p electrode, the n electrode, and the snubber substrate from one another.

2. The semiconductor device according to claim 1, wherein the insulating component includes an insulating ceramic substrate, and the p electrode, the n electrode, and the snubber substrate are fixed to the ceramic substrate.

3. The semiconductor device according to claim 1, wherein the base further includes a base plate, the snubber substrate is fixed above the base plate, and the insulating component includes:
   an insulating first ceramic substrate disposed between the base plate and the p electrode; and
   an insulating second ceramic substrate disposed between the base plate and the n electrode.

4. The semiconductor device according to claim 1, wherein the base further includes a metal pattern insulated by the insulating component from the p electrode and the n electrode, and
   the snubber substrate is fixed to the metal pattern.

5. The semiconductor device according to claim 4, wherein the base further includes a base plate electrically connected to the metal pattern, and
   the metal pattern is fixed above the base plate.

6. The semiconductor device according to claim 5, wherein the insulating component includes an insulating ceramic substrate disposed between the metal pattern and the base plate, and
   the metal pattern is electrically connected to the base plate through a through hole formed in the ceramic substrate.

7. The semiconductor device according to claim 1, further comprising
   a bonding material for fixing the snubber substrate to the base, the bonding material containing silicone.

8. The semiconductor device according to claim 1, wherein the semiconductor element contains silicon or a wide bandgap semiconductor.

9. A method for manufacturing the semiconductor device according to claim 1,
   wherein the snubber substrate is an insulating ceramic substrate, the method comprising
   printing a paste and a conductor on the snubber substrate, and forming a resistor by firing the paste to form the snubber circuit.

10. A method for manufacturing the semiconductor device according to claim 1, the method comprising
    fixing the semiconductor element to the base, and then fixing the snubber substrate to the base.

* * * * *